(12) United States Patent
Kameda

(10) Patent No.: US 8,227,734 B2
(45) Date of Patent: Jul. 24, 2012

(54) SOLID STATE IMAGE PICKUP DEVICE HAVING OPTICAL BLACK PIXELS WITH TEMPERATURE CHARACTERISTICS ABOVE AND BELOW TEMPERATURE CHARACTERISTICS OF APERTURE PIXELS

(75) Inventor: Shinjiro Kameda, Kanagawa (JP)

(73) Assignee: Sony Corporation, Tokyo (JP)

( * ) Notice: Subject to any disclaimer, the term of this patent is extended or adjusted under 35 U.S.C. 154(b) by 124 days.

(21) Appl. No.: 12/012,679

(22) Filed: Feb. 5, 2008

(65) Prior Publication Data

US 2008/0197268 A1 Aug. 21, 2008

(30) Foreign Application Priority Data

Feb. 21, 2007 (JP) ................ P2007-040654

(51) Int. Cl.
*H01L 27/00* (2006.01)
*H01J 40/14* (2006.01)
(52) U.S. Cl. ................... 250/208.1; 250/214 R
(58) Field of Classification Search ............... 250/208.1, 250/214.1, 216, 214 R; 257/431, 432, 435, 257/443–445, 290–292; 348/243–245, 294, 348/302, 311, 314, 315
See application file for complete search history.

(56) References Cited

U.S. PATENT DOCUMENTS 7,427,740 B2 * 9/2008 Park et al. ............ 250/214.1
2006/0114342 A1 * 6/2006 Egawa ..................... 348/241

FOREIGN PATENT DOCUMENTS

| JP | 10-107245 | 4/1998 |
| JP | 2003-153092 | 5/2003 |
| JP | 2005-175930 | 6/2005 |

* cited by examiner

*Primary Examiner* — Pascal M Bui Pho
(74) *Attorney, Agent, or Firm* — Robert J. Depke; Rockey, Depke & Lyons, LLC

(57) ABSTRACT

There is provided a solid-state imaging device including: a plurality of aperture pixels configured to be used for capturing of an image; a plurality of first light-shielded pixels configured to be shielded from light for detection of an optical black level, a temperature dependence of a dark current in the first light-shielded pixels being larger than a temperature dependence of a dark current in the aperture pixels; and a plurality of second light-shielded pixels configured to be shielded from light for detection of an optical black level, a temperature dependence of a dark current in the second light-shielded pixels being smaller than a temperature dependence of a dark current in the aperture pixels.

9 Claims, 14 Drawing Sheets

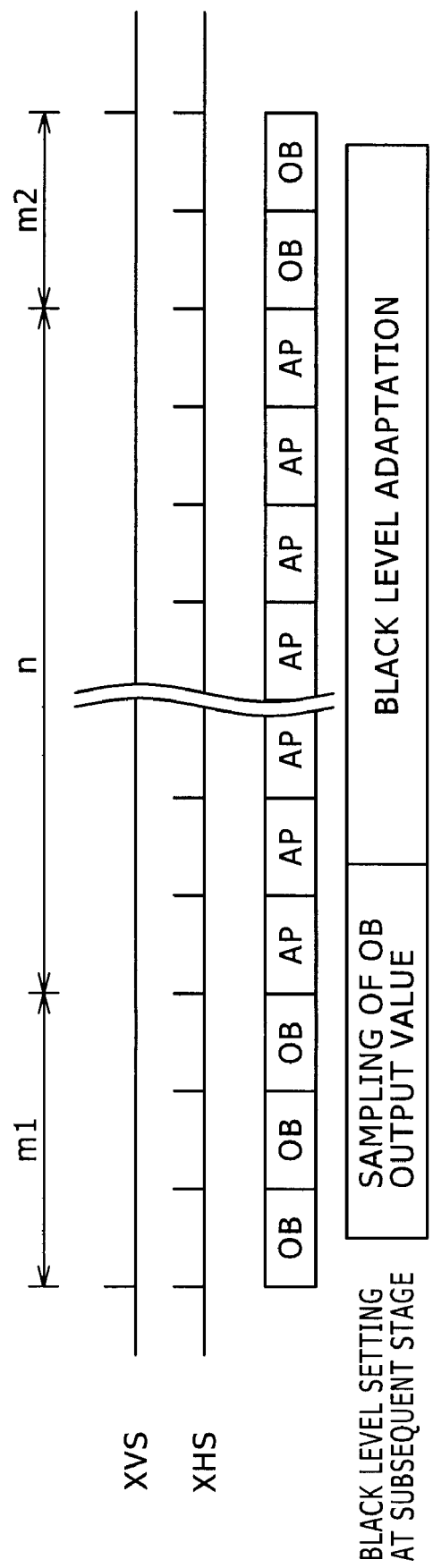

SOLID STATE IMAGE PICKUP DEVICE HAVING OPTICAL BLACK PIXELS WITH TEMPERATURE CHARACTERISTICS ABOVE AND BELOW TEMPERATURE CHARACTERISTICS OF APERTURE PIXELS

CROSS REFERENCES TO RELATED APPLICATIONS

The present invention contains subject matter related to Japanese Patent Application JP 2007-040654 filed in the Japan Patent Office on Feb. 21, 2007, the entire contents of which being incorporated herein by reference.

BACKGROUND OF THE INVENTION

1. Field of the Invention

The present invention relates to a solid-state imaging device and imaging apparatus that detect the optical black level of an image signal in order to obtain an image having favorable contrast.

2. Description of the Related Art

Typically a dark current in a solid-state imaging device changes depending on the temperature and the accumulation time. Therefore, a signal output value in the optically-black state, i.e., in the no-exposure state, changes depending on the temperature and the accumulation time, which often affects an image. For example, when a certain fixed signal level is used as the basis of A/D conversion, the digital value of an optical black level will change depending on the temperature. Accordingly, a black part in an image obtained after image processing will float as a whitish area or sink as an intense-black area depending on the temperature, which results in unstable contrast of the image.

In order to avoid such a problem, in many solid-state imaging devices, light-shielded pixels (hereinafter, referred to also as optical black (OB) pixels) that are shielded from light are provided around aperture pixels. By reading out these OB pixels, an optical black level can be output on a frame-by-frame basis. Thus, even when the temperature changes, the optimum reference level for A/D conversion can be estimated.

FIG. 13 is a diagram showing one example of a related-art solid-state imaging device. FIGS. 14 and 15 show an example of signal outputting from the related-art solid-state imaging device.

As shown in FIG. 13, this solid-state imaging device includes an aperture pixel part 201 having plural aperture pixels 211 for capturing an image, an OB pixel part 202 having plural OB pixels 212 provided around the aperture pixel part 201, a V selection circuit 203, and a read-out circuit 204. From the aperture pixels 211 of the aperture pixel part 201 and the OB pixels 212 of the OB pixel part 202, OB pixel rows, aperture pixel rows, and OB pixel rows are sequentially selected by the V selection circuit 203 in accordance with horizontal synchronizing signals, and the pixel values of the selected pixels are read out by the read-out circuit 204.

As shown in FIG. 14, outputting of an image of one frame is triggered by a vertical synchronizing signal (XVS) and is completed until the next vertical synchronizing signal. In the period between the vertical synchronizing signals, signals of each one row are output in accordance with horizontal synchronizing signals (XHS) serving as triggers of the signal outputting.

For example, FIG. 15 shows an example of signal outputting when the number m1 of former OB pixel rows is three and the number m2 of latter OB pixel rows is two. As shown in FIGS. 13 to 15, the output values of the OB pixels 212 read out in an initial period of one frame are sampled, and the sampling result is applied to the black level of the aperture pixels 211 in this frame. This can cancel temperature changes within one frame even when the temperature sharply changes.

However, as pointed out also in Japanese Patent Laid-open No. Hei 10-107245 (Patent Document 1), it is known that when a light-shielding film is provided above pixels, it is difficult to strictly equalize the dark current amount of the aperture pixels to that of the OB pixels because of difference in the surface level therebetween and so on. Therefore, the dark current amount differs between the aperture pixels and the OB pixels even when there is no change in the use temperature within one frame. In the worst case, this difference possibly affects image contrast. Furthermore, even when the difference in the dark current amount is small, problems often occur if the accumulation time is extended for capturing of a dark image for example.

There is another method in which photodiodes are not provided in OB pixels in order to suppress the dark current in the OB pixels. However, in this method, the dark current in the OB pixels is extremely smaller than that in the aperture pixels. As a result, an error in the black level occurs depending on the temperature and the accumulation time.

SUMMARY OF THE INVENTION

There is a need for the present invention to provide a solid-state imaging device and imaging apparatus that can obtain an image having favorable contrast by correctly matching the dark current amount of aperture pixels with that of OB pixels to thereby accurately detect an optical black level.

According to an embodiment of the present invention, there is provided a solid-state imaging device that includes a plurality of aperture pixels configured to be used for capturing of an image, and a plurality of first light-shielded pixels configured to be shielded from light for detection of an optical black level. The temperature dependence of a dark current in the first light-shielded pixels is larger than that in the aperture pixels. In addition, the solid-state imaging device further includes a plurality of second light-shielded pixels configured to be shielded from light for detection of an optical black level. The temperature dependence of a dark current in the second light-shielded pixels is smaller than that in the aperture pixels. The pixel values of the plurality of aperture pixels, the plurality of first light-shielded pixels, and the plurality of second light-shielded pixels are read out independently of each other. The pixel values of the plurality of first light-shielded pixels are read out a desired number of times and the pixel values of the plurality of second light-shielded pixels are read out a desired number of times so that the average temperature characteristic of the first light-shielded pixels and the second light-shielded pixels may correspond with the temperature characteristic of the aperture pixels.

According to another embodiment of the present invention, there is provided imaging apparatus that includes an imager configured to employ a solid-state imaging device, a controller configured to control the imager, and an operation unit configured to be used to operate the imager. The solid-state imaging device includes a plurality of aperture pixels that are used for capturing of an image, and a plurality of first light-shielded pixels that are shielded from light for detection of an optical black level. The temperature dependence of a dark current in the first light-shielded pixels is larger than that in the aperture pixels. In addition, the solid-state imaging device further includes a plurality of second light-shielded pixels that are shielded from light for detection of an optical black level. The temperature dependence of a dark current in the second light-shielded pixels is smaller than that in the aperture pixels. The pixel values of the plurality of aperture pixels, the plurality of first light-shielded pixels, and the plurality of second light-shielded pixels are read out independently of each other. The pixel values of the plurality of first light-shielded pixels are read out a desired number of times and the pixel values of the plurality of second light-shielded pixels are read out a desired number of times so that the average temperature characteristic of the first light-shielded pixels and the second light-shielded pixels may correspond with the temperature characteristic of the aperture pixels.

In the solid-state imaging device and the imaging apparatus according to the embodiments of the present invention, the pixel values of the plurality of aperture pixels, the plurality of first light-shielded pixels, and the plurality of second light-shielded pixels are read out independently of each other. Furthermore, the pixel values of the plurality of first light-shielded pixels and the plurality of second light-shielded pixels are read out the respective desired numbers of times so that the average temperature characteristic of the first light-shielded pixels and the second light-shielded pixels may correspond with the temperature characteristic of the aperture pixels.

Therefore, because the average temperature characteristic of the first and second light-shielded pixels can be equalized to the temperature characteristic of the aperture pixels, an optical black level can be accurately detected by correctly matching the dark current amount of the aperture pixels with that of the light-shielded pixels. Consequently, an image having favorable contrast can be obtained.

BRIEF DESCRIPTION OF THE DRAWINGS

FIG. 15 is an example of signal outputting in the related-art solid-state imaging device.

DETAILED DESCRIPTION OF THE PREFERRED EMBODIMENTS

A solid-state imaging device and imaging apparatus according to embodiments of the present invention will be described below with reference to the drawings.

Figure 1:
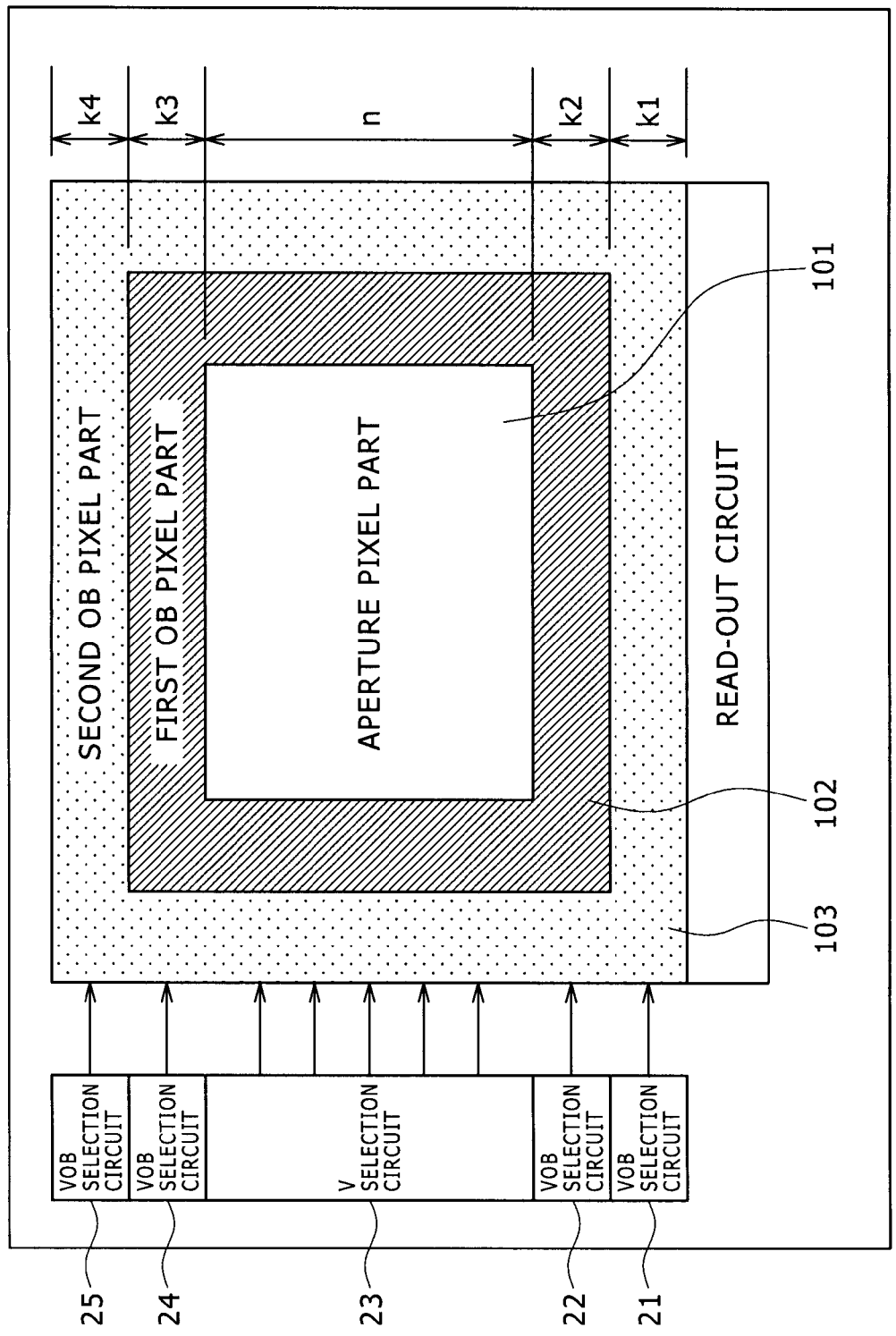
FIG. 1 is a diagram showing the configuration of a solid-state imaging device according to one embodiment of the present invention.

FIG. 1 is a diagram showing the schematic configuration of the solid-state imaging device according to one embodiment of the present invention.

This solid-state imaging device includes an aperture pixel part 101, a first optical black part 102 provided around the aperture pixel part 101, and a second optical black part 103 provided around the first optical black part 102.

The aperture pixel part 101 is formed of plural aperture pixels 11 on n rows and plural columns for capturing an image. The first optical black part 102 is formed of plural first OB light-shielded pixels 12 that are shielded from light for detection of an optical black level. The temperature dependence of the dark current in the first OB pixels 12 is larger than that in the aperture pixels 11. The plural first OB pixels 12 form a matrix of (k2+n+k3) rows and plural columns together with the plural aperture pixels 11. The second optical black part 103 is formed of plural second OB light-shielded pixels 13 that are shielded from light for detection of an optical black level. The temperature dependence of the dark current in the second OB pixels 13 is smaller than that in the aperture pixels 11. The plural second OB pixels 13 form a matrix of (k1+k2+n+k3+k4) rows and plural columns together with the plural aperture pixels 11 and the plural first OB pixels 12.

Furthermore, this solid-state imaging device includes a second lower-OB-pixel V selection circuit 21, a first lower-OB-pixel V selection circuit 22, an aperture-pixel V selection circuit 23, a first upper-OB-pixel V selection circuit 24, a second upper-OB-pixel V selection circuit 25, and a read-out circuit 30.

The second lower-OB-pixel V selection circuit 21 is a selection circuit for the second OB pixels (lower OB2) 13 on the k1 rows. The first lower-OB-pixel V selection circuit 22 is a selection circuit for the first OB pixels (lower OB1) 12 and the second OB pixels 13 on the k2 rows. The aperture-pixel V selection circuit 23 is a selection circuit for the aperture pixels 11, the first OB pixels 12, and the second OB pixels 13 on the n rows. The first upper-OB-pixel V selection circuit 24 is a selection circuit for the first OB pixels (upper OB1) 12 and the second OB pixels 13 on the k3 rows. The second upper-OB-pixel V selection circuit 25 is a selection circuit for the second OB pixels (upper OB2) 13 on the k4 rows.

The read-out circuit 30 reads out the aperture pixels 11, the first OB pixels 12, and the second OB pixels 13 on the row selected by any of the second lower-OB-pixel V selection circuit 21, the first lower-OB-pixel V selection circuit 22, the aperture-pixel V selection circuit 23, the first upper-OB-pixel V selection circuit 24, and the second upper-OB-pixel V selection circuit 25.

Figure 2:
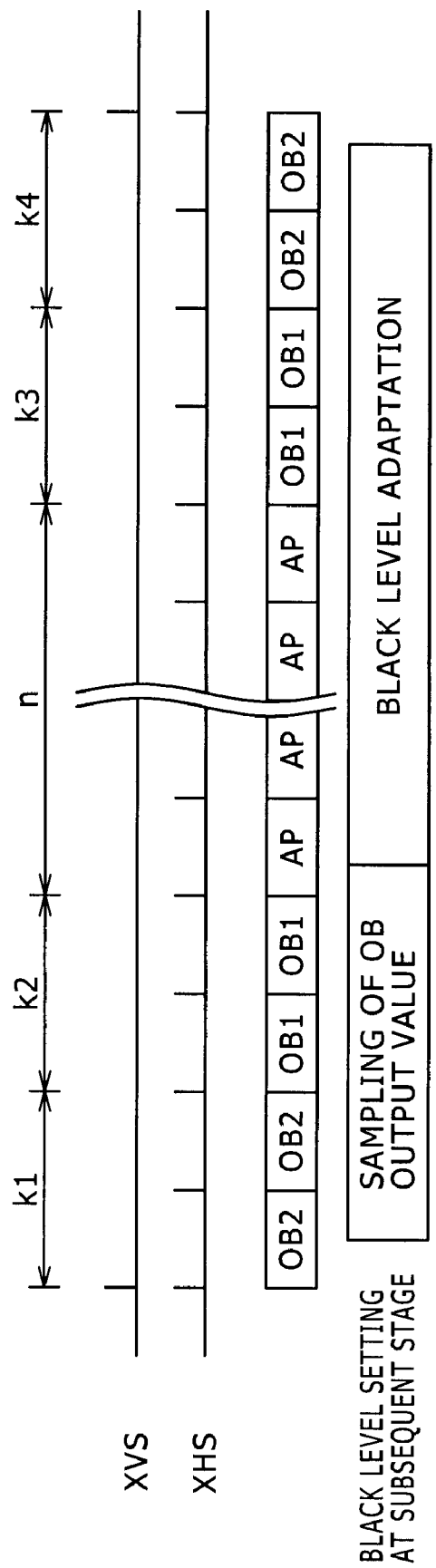
FIG. 2 is a diagram showing an example of signal outputting in normal reading-out in the solid-state imaging device.

FIG. 2 is a diagram showing an example of signal outputting in normal reading-out in this solid-state imaging device. This example corresponds to the case in which each of k1, k2, k3, and k4 (the numbers of rows) in FIG. 1 is two.

The selection operations by the second lower-OB-pixel V selection circuit 21, the first lower-OB-pixel V selection circuit 22, the aperture-pixel V selection circuit 23, the first upper-OB-pixel V selection circuit 24, and the second upper-OB-pixel V selection circuit 25 are carried out independently of each other. By changing the order of activation of the V selection circuits and the number of repetitions of the activation, any optional order is designed as the order of reading-out of pixel rows. For example, although the normal reading-out is carried out in the order of lower OB2, lower OB1, aperture pixels, upper OB1, and upper OB2, it is also possible that initially reading-out from lower OB2 is repeated twice, and then aperture pixels are read out, and thereafter lower OB1 is read out.

Figure 3:
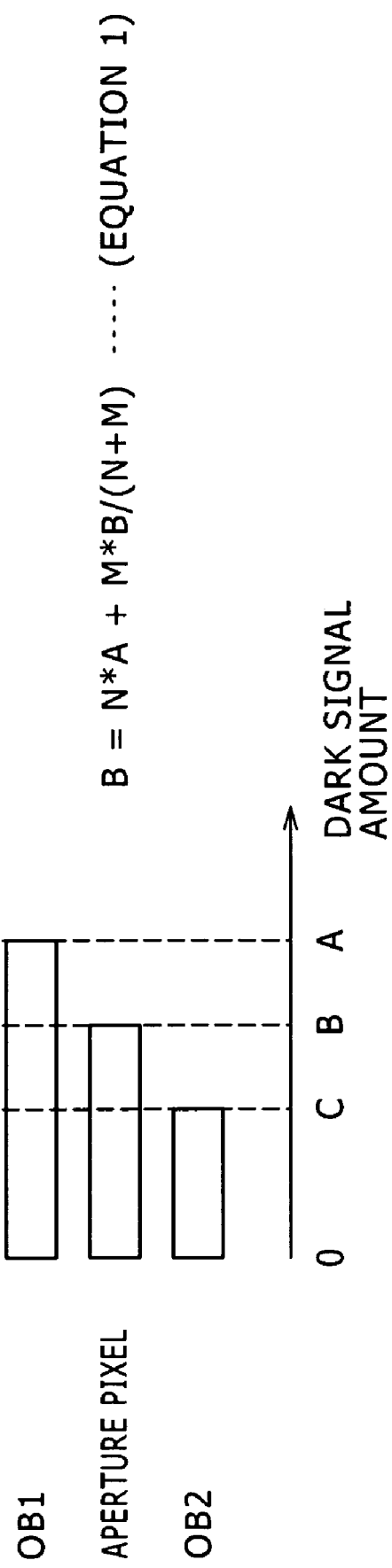
FIG. 3 is a diagram showing a method for setting a black level.
Figure 4:
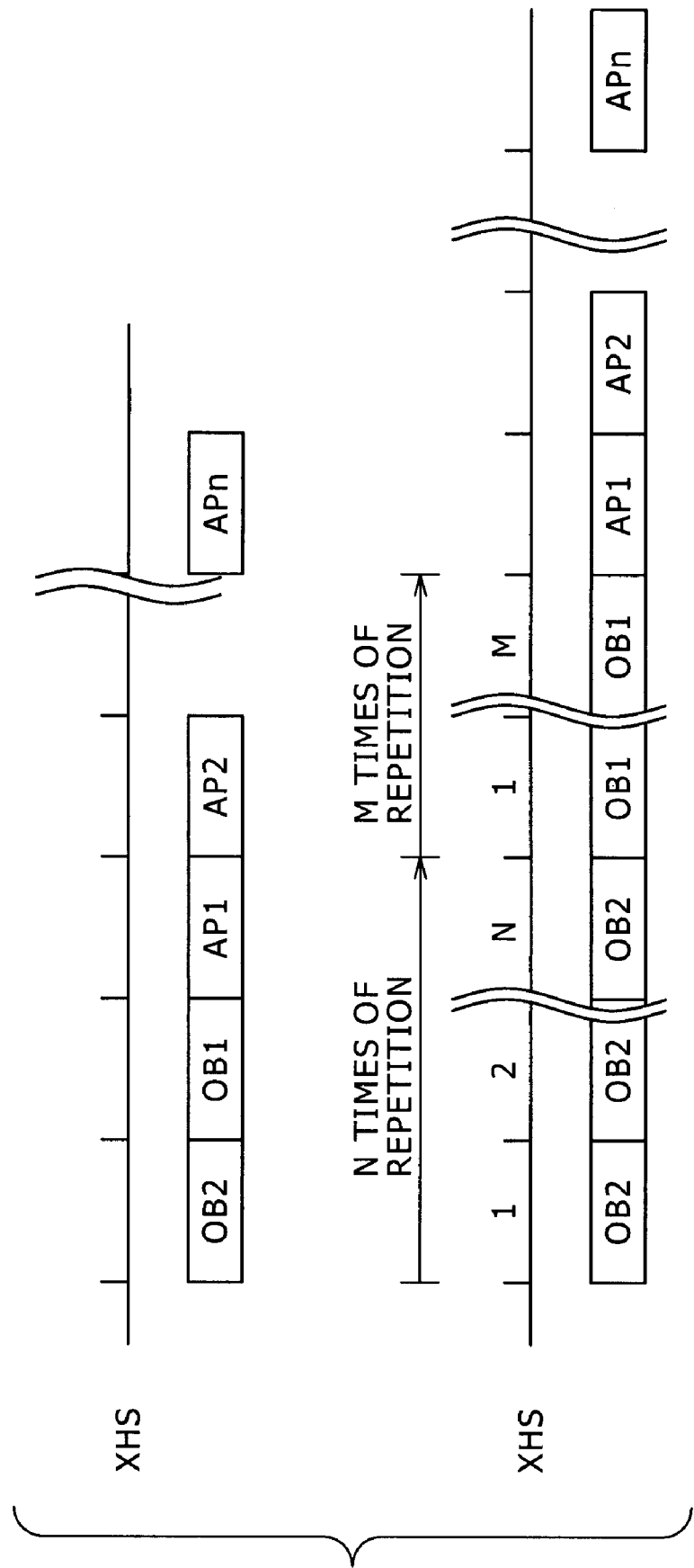
FIG. 4 is a diagram showing a method for reading out pixels in black level setting.
Figure 5:
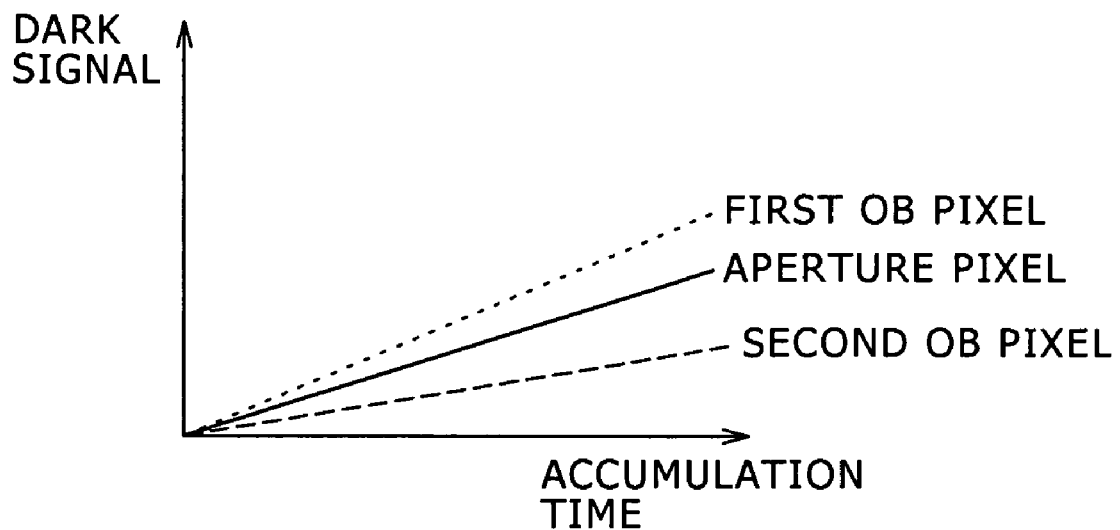
FIG. 5 is a diagram showing the relationships between the accumulation time and the dark current amount regarding an aperture pixel, a first OB pixel, and a second OB pixel.
Figure 6:
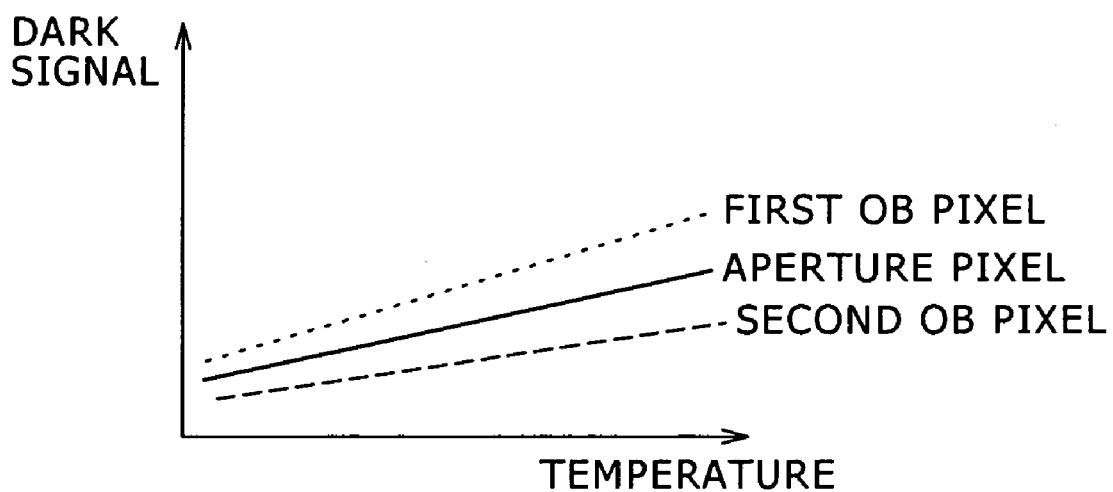
FIG. 6 is a diagram showing the relationships between the temperature and the dark current amount regarding the aperture pixel, the first OB pixel, and the second OB pixel.

FIG. 3 is a diagram showing a method for setting a black level. FIG. 4 is a diagram showing a method for reading out pixels in black level setting. FIG. 5 is a diagram showing the relationships between the accumulation time and the dark current amount regarding the aperture pixel, the first OB pixel, and the second OB pixel. FIG. 6 is a diagram showing the relationships between the temperature and the dark current amount regarding the aperture pixel, the first OB pixel, and the second OB pixel.

As shown in FIG. 3, the black level setting is carried out by sampling two pixel values of lower OB2 and two pixel values of lower OB1. If the dark signal amounts of the aperture pixels 11, the first OB pixels 12, and the second OB pixels 13 have a relationship like that shown in FIG. 3, integer numbers M and N that satisfy Equation 1 shown in FIG. 3 are calculated. Subsequently, as shown in FIG. 4, the second OB pixels 13 (pixel value OB2) are repeatedly read out N times and the first OB pixels 12 (pixel value OB1) are repeatedly read out M times to thereby obtain the average of OB2 and OB1. This operation allows accurate reproduction of the dark current value of the aperture pixels 11. In general, the temperature and the accumulation time are in proportion to the dark current amount as shown in FIGS. 5 and 6 in many cases. Therefore, if the ratio of the dark current amounts at a certain temperature can be obtained, it is possible to allow the obtained average of OB2 and OB1 to follow the dark current amount of the aperture pixels with a certain degree of accuracy even when the accumulation time changes after the ratio is obtained.

The ratio of the dark current amounts among the aperture pixels 11, the first OB pixels 12, and the second OB pixels 13 at a certain temperature can be obtained comparatively accurately in the following manner. Initially, in test manufacturing, the output ratios among the aperture pixels 11, the first OB pixels 12 (OB1), and the second OB pixels 13 (OB2) at the respective temperatures in the use temperature range are statistically analyzed, and a list of the output ratios is created. Subsequently, this list is prepared in advance in any unit of imaging apparatus, such as a solid-state imaging device or DSP at the subsequent stage. This makes it possible to substantially accurately estimate the output of the aperture pixels 11 from the outputs of OB1 and OB2 in one frame, and obtain the output ratio. It will be obvious that more accurate result can be obtained when the temperature step size in this list is smaller. However, it will also be possible to use an approximate curve for a reduced data amount.

If the output ratio is thus known in advance and a sensor is incorporated in a system in which a simple calculation unit for product and sum is included in the sensor, a subsequent-stage DSP, or the like, there is no need to repeatedly read out OB2 and OB1. Specifically, the output average of the aperture pixels 11 can be predicted by executing arithmetic operation including multiplication of the output average of OB2 by N, instead of N times of reading-out of OB2, and multiplication of the output average of OB1 by M.

Figure 7A:
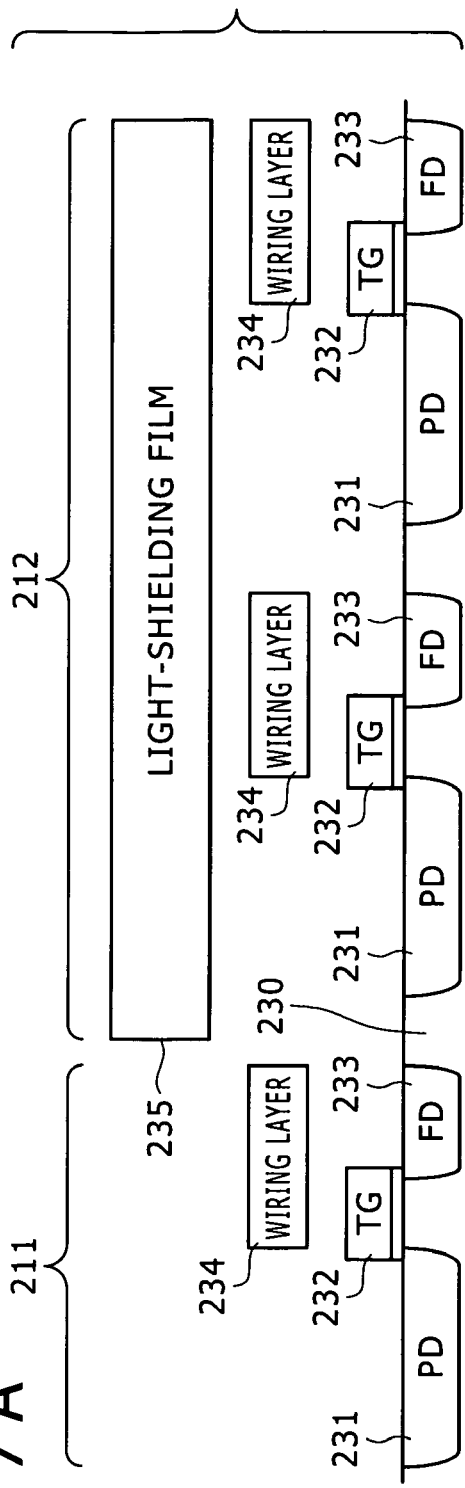
FIG. 7A is a diagram showing a sectional structure of a related-art solid-state imaging device.
Figure 7B:
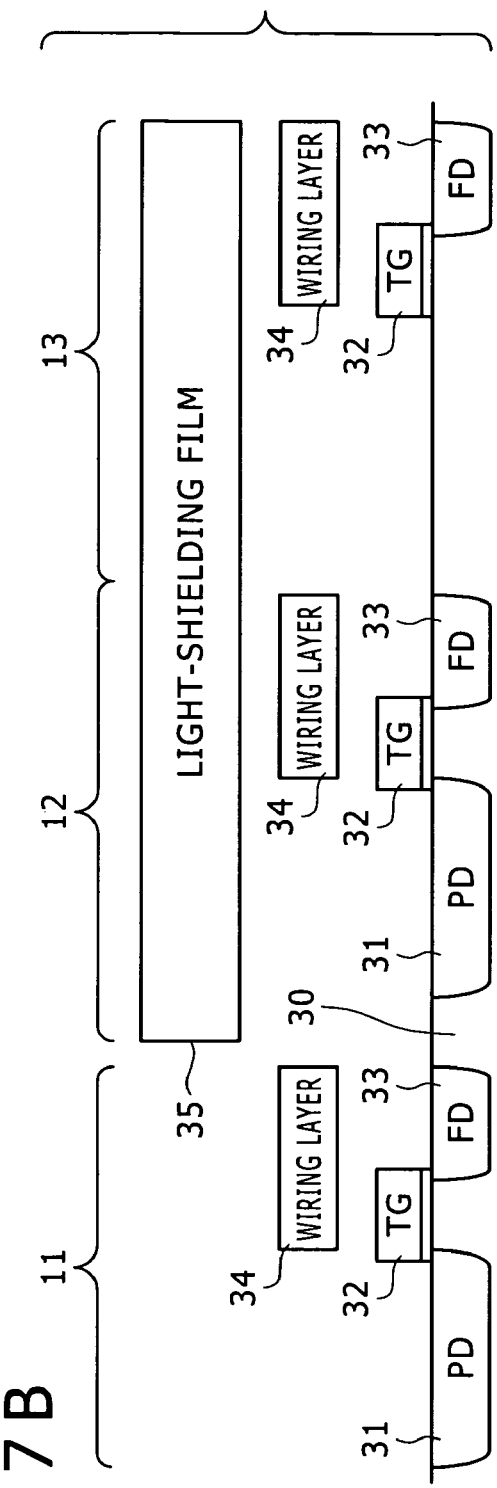
FIG. 7B is a diagram showing a sectional structure of the solid-state imaging device according to the embodiment of the present invention.
Figure 8:
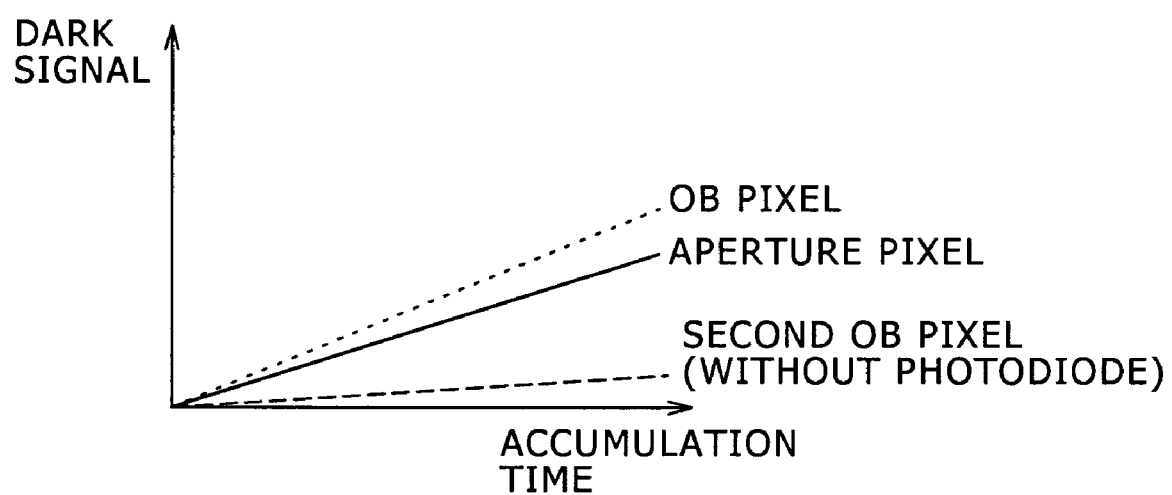
FIG. 8 is a diagram showing the relationships between the accumulation time and the dark current amount regarding the aperture pixel, the first OB pixel, and the second OB pixel.

FIG. 7A is a diagram showing a sectional structure of the related-art solid-state imaging device. FIG. 7B is a diagram showing a sectional structure of the solid-state imaging device according to the embodiment of the present invention. FIG. 8 is a diagram showing the relationships between the accumulation time and the dark current amount regarding the aperture pixel, the first OB pixel, and the second OB pixel.

As shown in FIG. 7A, the related-art solid-state imaging device includes the aperture pixels 211 and the OB pixels 212. The aperture pixels 211 and the OB pixels 212 each include a photoelectric converter (photodiode (PD)) 231, a transfer gate (TG) 232, and a read-out part (floating diffusion (FD)) 233 formed by using a semiconductor substrate 230. A wiring layer 234 is formed above these elements, and a light-shielding film 235 is formed above the wiring layers 234 of the OB pixels 212.

As shown in FIG. 7B, the solid-state imaging device of the embodiment includes the aperture pixels 11, the first OB pixels 12, and the second OB pixels 13. The aperture pixels 11 and the first OB pixels 12 each include a PD 31, a TG 32, and an FD 33 formed by using a semiconductor substrate 30. On the other hand, the second OB pixels 13 do not include the PD 31 but include only the TG 32 and the FD 33. A wiring layer 34 is formed above these elements, and a light-shielding film 35 is formed above the wiring layers 34 of the first OB pixels 12 and the second OB pixels 13.

That is, the first OB pixel 12 is provided with a photodiode, whereas the second OB pixel 13 is not provided with a photodiode, as one example of the way of forming the first and second OB pixels 12 and 13, of which dark currents have different temperature characteristics.

FIG. 8 is a diagram showing the relationships between the accumulation time and the dark current amount regarding the aperture pixel, the first OB pixel, and the second OB pixel.

As shown in FIG. 8, the dark current in the first OB pixel 12 with a photodiode is often larger than that in the aperture pixel 11 due to surface level difference. In contrast, the second OB pixel 13 without a photodiode does not include a major generation source for the dark current, and hence the dark current therein can be set greatly smaller than that in the aperture pixel 11. In this manner, the first and second OB pixels 12 and 13 can be provided by using a simple configuration based on the presence or absence of a photodiode.

If the first and second OB pixels 12 and 13 are thus formed based on the presence or absence of a photodiode, another one advantage can also be expected. Specifically, it can be expected that a comparatively stable black level is output even when improper light such as oblique light intrudes into OB pixels.

Figure 9:
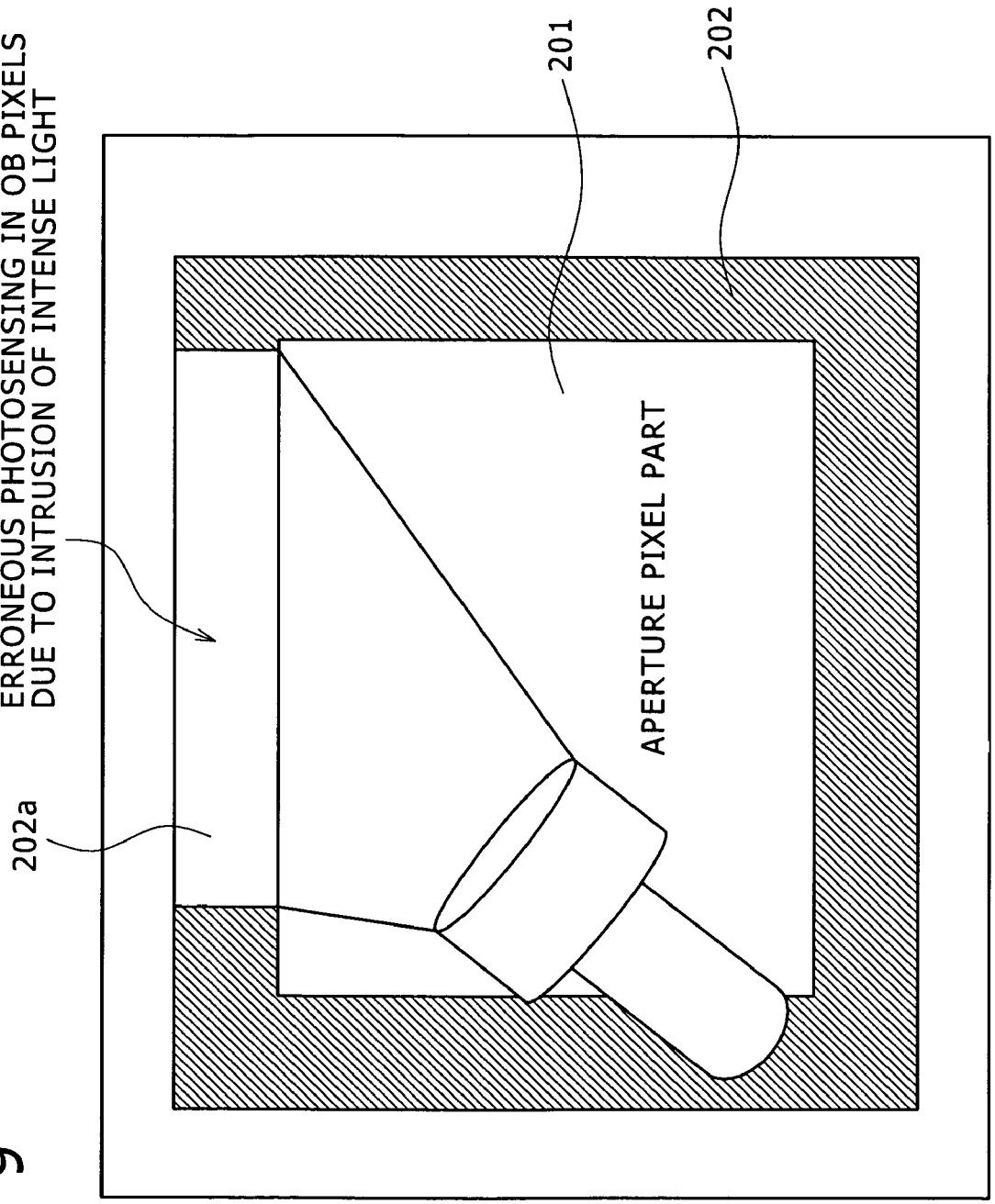
FIG. 9 is a diagram showing light intrusion into the related-art solid-state imaging device.

FIG. 9 is a diagram showing light intrusion into the related-art solid-state imaging device.

Specifically, FIG. 9 shows light intrusion into a partial area 202a of the OB pixel part 202 in the related-art solid-state imaging device. In this case, because the OB pixels 212 each include the PD 231, the light intrusion causes erroneous photosensing in these OB pixels, which precludes outputting of an accurate black level.

Figure 10:
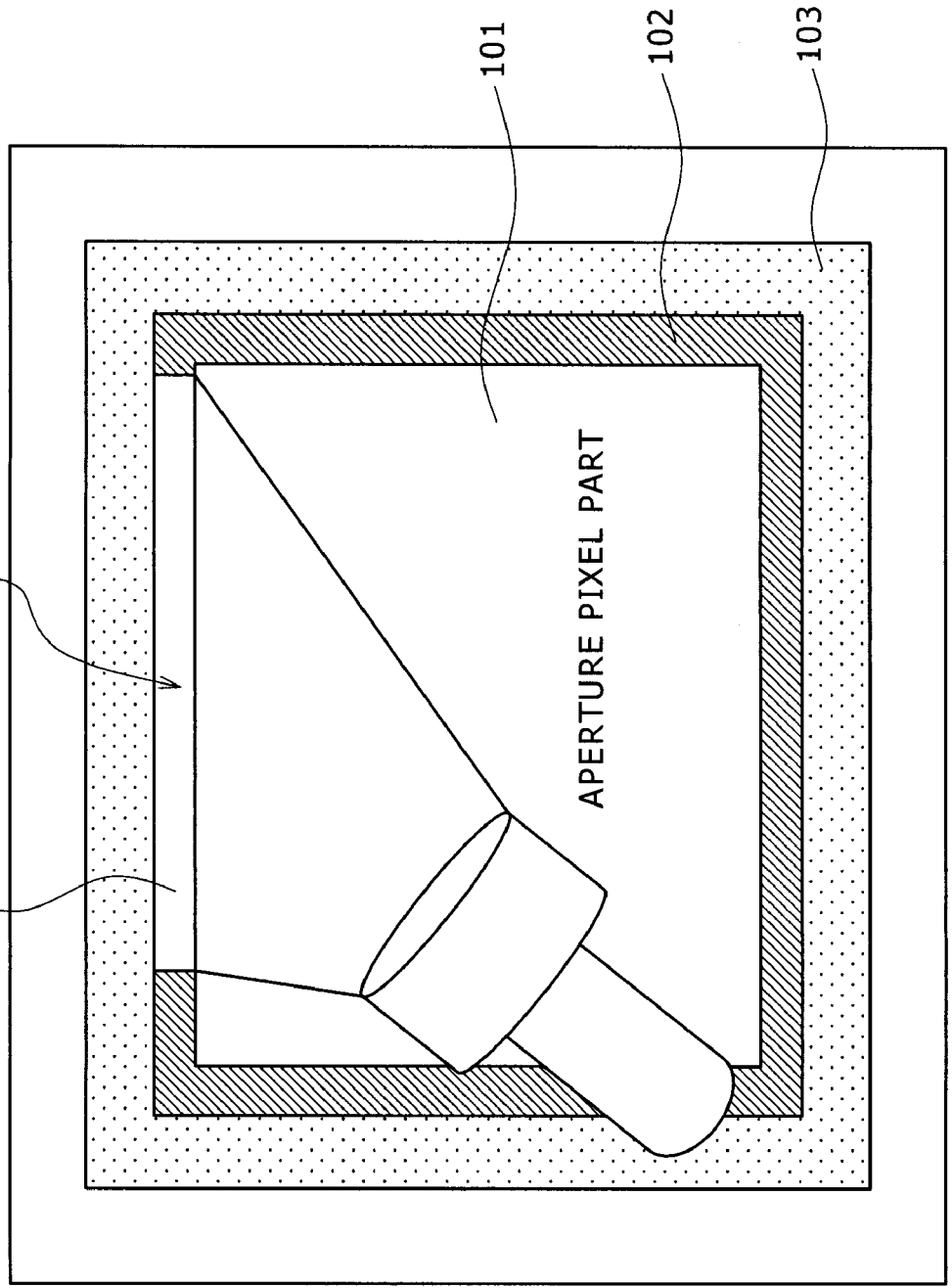
FIG. 10 is a diagram showing light intrusion into the solid-state imaging device according to the embodiment of the present invention.

FIG. 10 is a diagram showing light intrusion into the solid-state imaging device according to the embodiment of the present invention.

Specifically, FIG. 10 shows light intrusion into a partial area 102a of the first OB pixel part 102 in the solid-state imaging device according to the embodiment. In this case, the light is not sensed in the second OB pixels 13 having no PD 31 but sensed only in the partial area 102a including the first OB pixels 12 with the PD 31. Therefore, as the average of the first and second OB pixels 12 and 13, the influence of the light intrusion can be made smaller than that in the related-art solid-state imaging device.

Furthermore, if the subsequent-stage DSP is so configured as to be capable of detecting abnormal output of the first and second OB pixels 12 and 13 and switching the pixels to be used for black level sampling, large variation in the black level can be avoided e.g. by using only the first OB pixels 12 when abnormal output of the second OB pixels 13 is detected.

Figure 11:
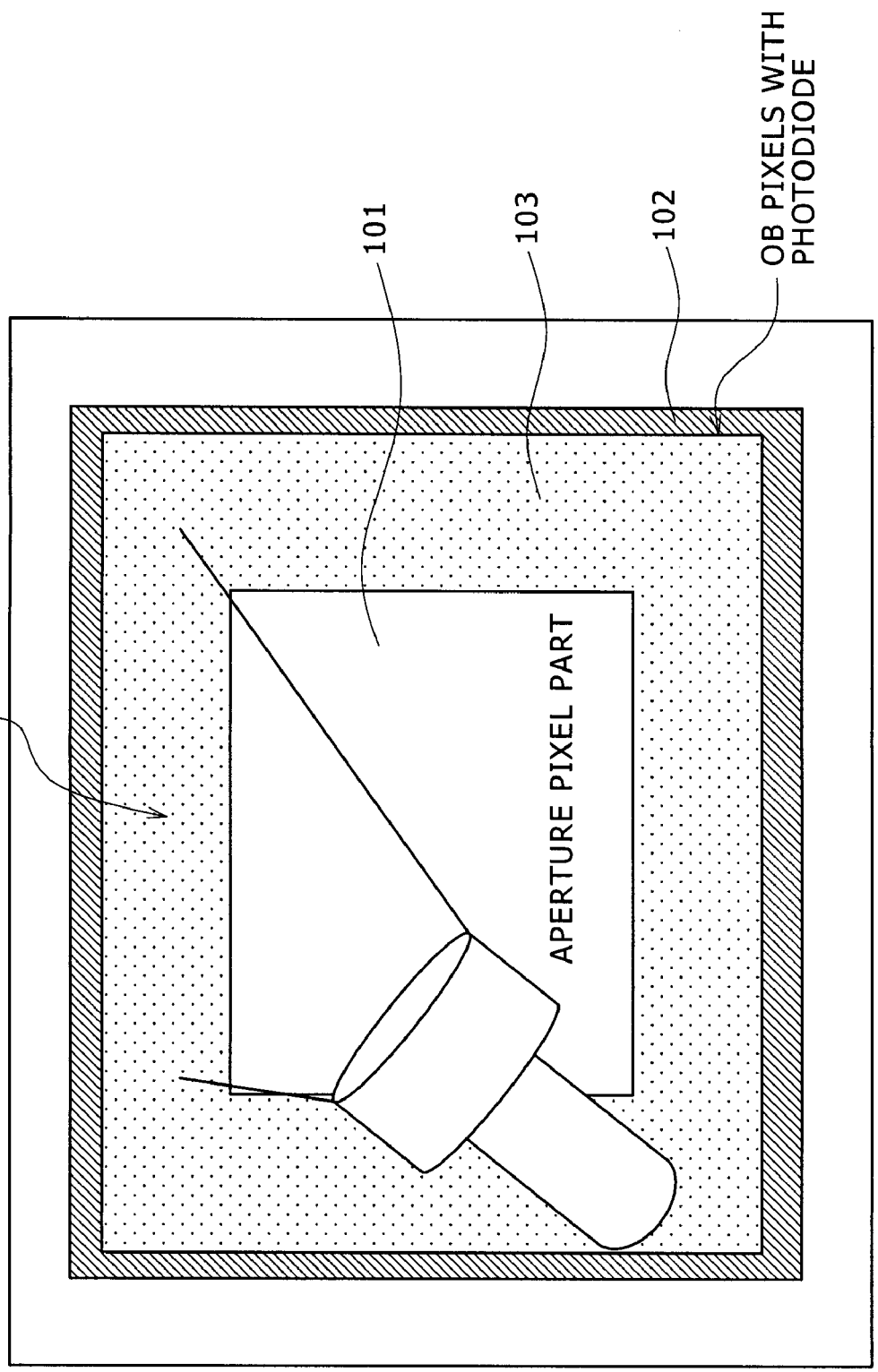
FIG. 11 shows an example obtained by interchanging the arrangements of the first and second OB pixels.

FIG. 11 shows an example obtained by interchanging the arrangements of the first and second OB pixels.

Specifically, as shown in FIG. 11, the second optical black part 103 including the second OB pixels 13 is provided around the aperture pixel part 101 including the aperture pixels 11, and the first optical black part 102 including the first OB pixels 12 is provided around the second optical black part 103. In the case of this configuration, because the second OB pixels 13 having no PD 31 are arranged around the aperture pixels 11, light intrusion until a depth equivalent to several pixels can be completely shutout.

However, in the case of considering variation in processing of manufacturing among the PDs 31 in the aperture pixels 11, it will be more advantageous to dispose the photodiode-including OB pixels 12 adjacent to the aperture pixels 11 having photodiodes as shown in FIG. 10, because the continuity of the PD pattern is more favorable in such a configuration. Thus, depending on the use purpose, whether processing or prevention of light intrusion is given more importance can be selected.

The following examples are also available as examples of the way of forming the first and second OB pixels 12 and 13.

Specifically, in one example, both the first and second OB pixels 12 and 13 have the PD 31, but the area of the PDs 31 in the first OB pixels 12 is larger than that of the PDs 31 in the second OB pixels 13.

In another example, both the first and second OB pixels 12 and 13 have the PD 31, but the impurity concentration in the PDs 31 in the first OB pixels 12 is higher than that in the PDs 31 in the second OB pixels 13.

In another example, both the first and second OB pixels 12 and 13 have the FD 33, but the area of the FDs 33 in the first OB pixels 12 is larger than that of the FDs 33 in the second OB pixels 13.

In another example, both the first and second OB pixels 12 and 13 have the FD 33, but the impurity concentration in the FDs 33 in the first OB pixels 12 is higher than that in the FDs 33 in the second OB pixels 13.

All of these examples can stably realize two kinds of dark current characteristics, and hence can be put into practical use.

Figure 12:
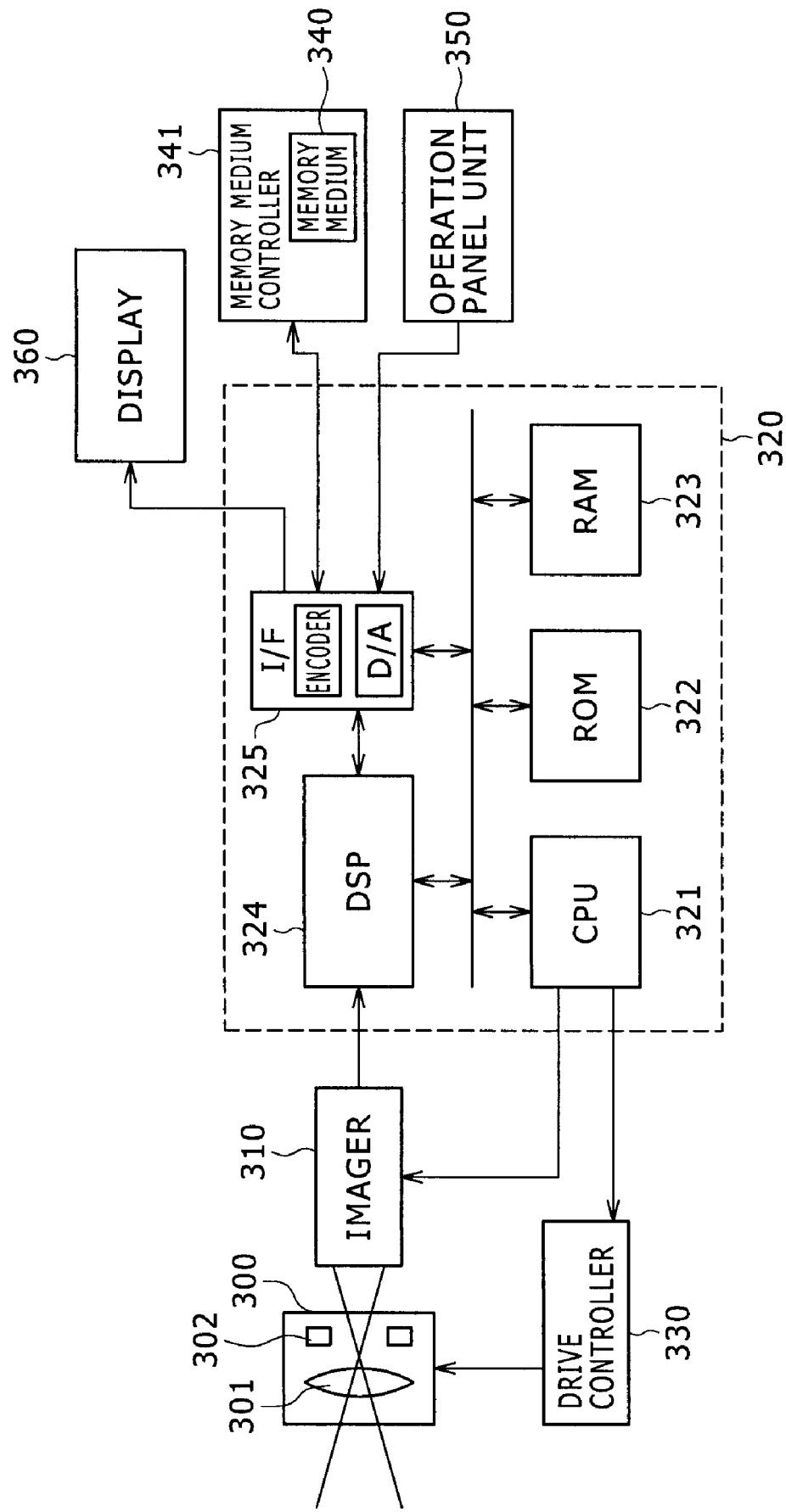
FIG. 12 is a diagram showing the configuration of camera apparatus according to one embodiment of the present invention.
Figure 13:
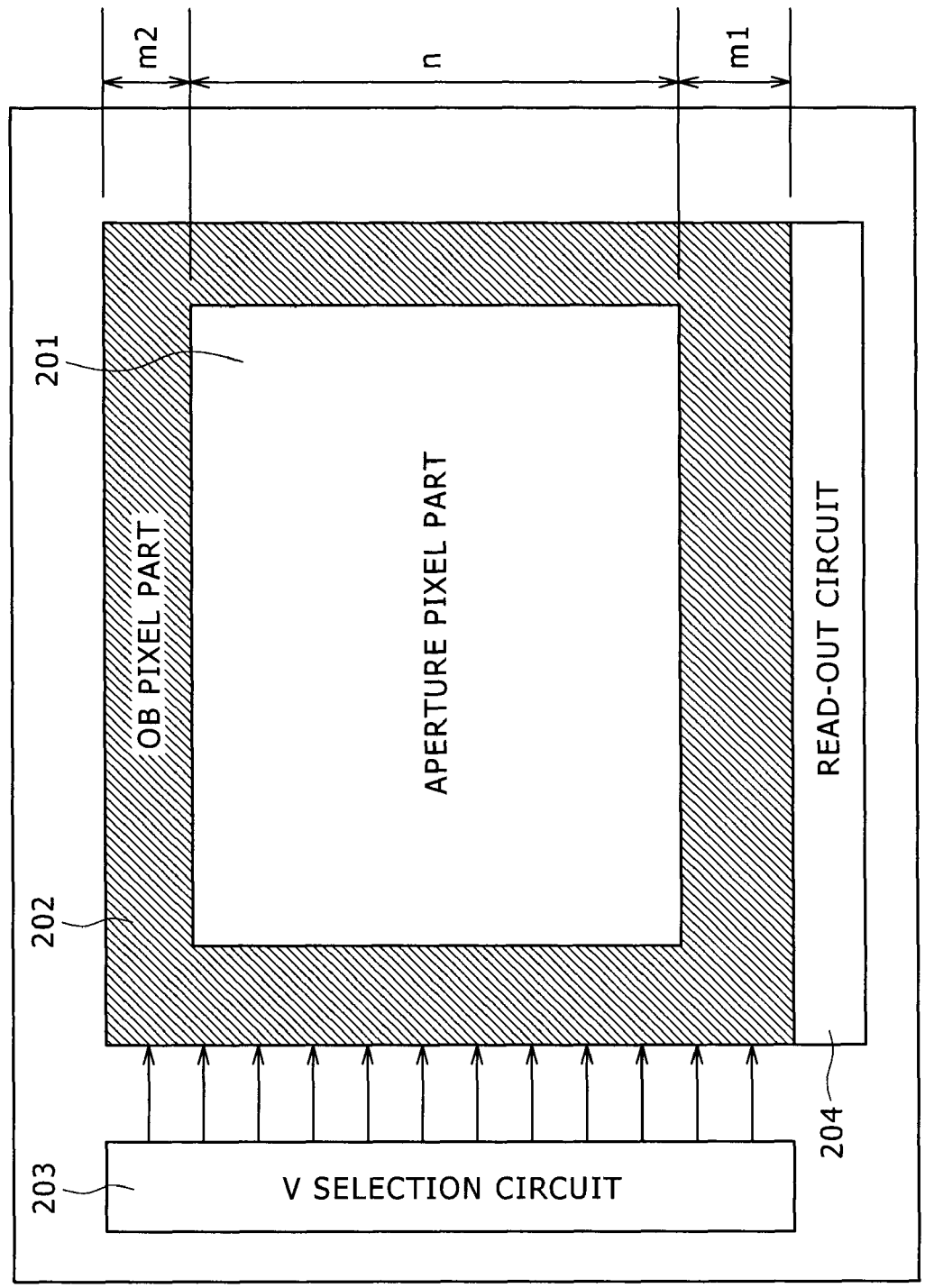
FIG. 13 is a diagram showing one example of a related-art solid-state imaging device.
Figure 14:
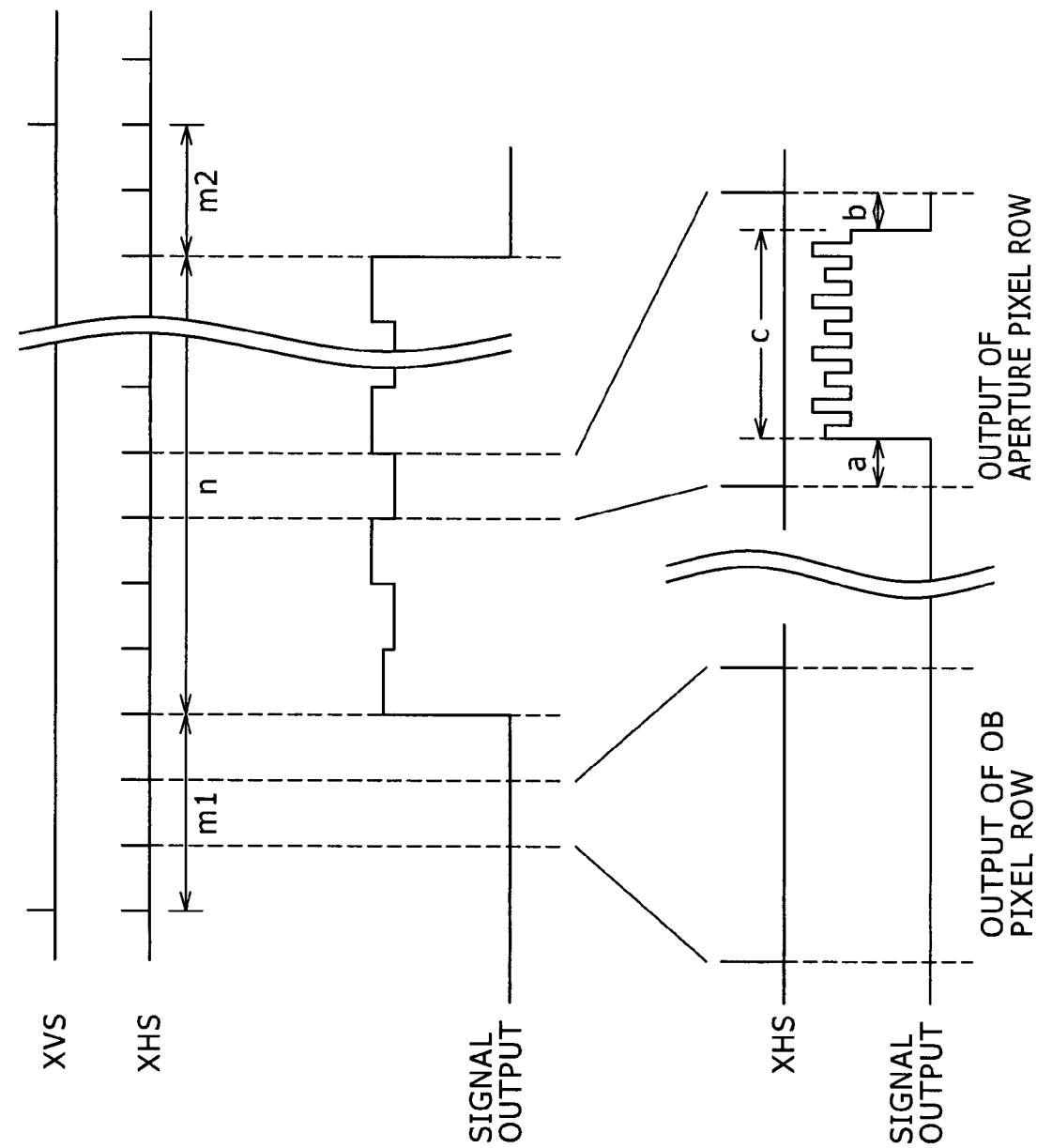
FIG. 14 is an example of signal outputting in the related-art solid-state imaging device.

FIG. 12 is a diagram showing the configuration of camera apparatus according to one embodiment of the present invention.

Referring to FIG. 12, an imager 310 captures an image of a subject by using e.g. the solid-state imaging device shown in FIG. 1 such as a CMOS image sensor, and outputs an imaging signal to a system controller 320 incorporated on a mainboard. Specifically, the imager 310 executes processing such as automatic gain control (AGC), optical black (OB) clamp, correlated double sampling (CDS), and A/D conversion for an output signal from the CMOS image sensor, and produces and outputs a digital imaging signal.

Although an imaging signal is converted to a digital signal in the imager 310 and then output to the system controller 320 in the present example, another configuration is also available in which an analog imaging signal is sent from the imager 310 to the system controller 320 and then converted to a digital signal in the system controller 320. Furthermore, it should be obvious that the processing in the imager 310 is not particularly limited but can be executed based on various methods.

An imaging optical system 300 includes a zoom lens 301, a diaphragm mechanism 302, and so on disposed in a lens barrel, and forms a subject image on the light-receiving part of the CMOS image sensor. The respective components in the imaging optical system 300 are mechanically driven for control such as auto-focus, under control by a drive controller 330 based on an instruction from the system controller 320.

The system controller 320 includes a CPU 321, a ROM 322, a RAM 323, a DSP 324, an external interface 325, and so on.

The CPU 321 sends instructions to the respective units in the camera apparatus with use of the ROM 322 and the RAM 323 to thereby control the entire system.

The DSP 324 executes various kinds of signal processing for an imaging signal from the imager 310, and produces a video signal (e.g., a Yuv signal) of a still image or moving image in a predetermined format.

The external interface 325 includes any of various kinds of encoders and D/A converters, and exchanges various kinds of control signals and data with external components connected to the system controller 320 (in the present example, a display 360, a memory medium 340, and an operation panel unit 350).

The display 360 is a small display unit, such as a liquid crystal panel, incorporated in the camera apparatus, and displays a captured image. Of course, it is also possible to transmit image data to an external large-size display for image displaying thereon, in addition to such a small display unit incorporated in the camera apparatus.

The memory medium 340 is e.g. any of various kinds of memory cards in which captured images can be timely stored, and is e.g. a medium that is interchangeable from a memory medium controller 341. As the memory medium 340, besides various kinds of memory cards, disk media employing magnetism and light are available.

The operation panel unit 350 includes input keys that allow a user to make various kinds of instructions in imaging operation with the camera apparatus. The CPU 321 monitors an input signal from the operation panel unit 350 and carries out various kinds of control based on the contents of the input signal.

By applying the embodiment of the present invention to such camera apparatus, high-grade imaging can be performed for various subjects. In the above-described configuration, the way of combining unit devices and unit modules as constituent elements of the system, the set scale, and so on can be properly selected based on the condition of product commercialization and so on. The imaging apparatus according to the embodiment of the present invention widely encompasses various kinds of modifications.

For the solid-state imaging device and the imaging apparatus according to the embodiments of the present invention, an imaging target (subject) is not limited to a general object such as a person and landscape but also encompasses special fine-image patterns captured by a counterfeit bill detector, fingerprint detector, and so on. The apparatus for this special image capturing is not typical camera apparatus shown in FIG. 12 but further includes a special imaging optical system and a signal processing system covering pattern analysis. Such special apparatus can also sufficiently exert advantages of the embodiment of the present invention and can realize accurate image detection.

Moreover, in the case of constructing a remote system such as a system for telemedicine, anticrime monitoring, or personal authentication, it is also possible to form an apparatus configuration including a communication module connected to a network as described above. In this manner, wide application can be realized.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a plurality of aperture pixels for capturing an image;
a plurality of first light-shielded pixels shielded from light for detection of a first dark current, the first light-shielded pixels having a first dark current generating rate at a given temperature that is larger than a dark current generating rate at the given temperature for the aperture pixels; and
a plurality of second light-shielded pixels shielded from light for detection of a second dark current, the second light-shielded pixels having a second dark current generating rate at the given temperature that is smaller than a dark current generating rate at the given temperature for the aperture pixels, the second light-shielded pixels having a different physical structure from the plurality of first light-shielded pixels, wherein
pixel values of the plurality of aperture pixels, the plurality of first light-shielded pixels, and the plurality of second light-shielded pixels are read out independently of each other, and a dark current for the aperture pixels is determined based on the first and second dark currents.

2. The solid-state imaging device according to claim 1, wherein
the plurality of first light-shielded pixels are provided around the plurality of aperture pixels, and the plurality of second light-shielded pixels are provided around the plurality of first light-shielded pixels.

3. The solid-state imaging device according to claim 1, wherein
the plurality of second light-shielded pixels are provided around the plurality of aperture pixels, and the plurality of first light-shielded pixels are provided around the plurality of second light-shielded pixels.

4. The solid-state imaging device according to claim 1, wherein
the first light-shielded pixels each include a photoelectric conversion element and an element for reading out a pixel value from the photoelectric conversion element and transferring the pixel value, and
the second light-shielded pixels each include an element for reading out and transferring a pixel value, and the element is an element other than a photoelectric conversion element.

5. The solid-state imaging device according to claim 1, wherein
the first light-shielded pixels and the second light-shielded pixels each include a photoelectric conversion element, and an area of the photoelectric conversion elements in the first light-shielded pixels is larger than an area of the photoelectric conversion elements in the second light-shielded pixels.

6. The solid-state imaging device according to claim 1, wherein
the first light-shielded pixels and the second light-shielded pixels each include a photoelectric conversion element, and an impurity concentration in the photoelectric conversion elements in the first light-shielded pixels is higher than an impurity concentration in the photoelectric conversion elements in the second light-shielded pixels.

7. The solid-state imaging device according to claim 1, wherein
the first light-shielded pixels and the second light-shielded pixels each include a floating diffusion, and an area of the floating diffusions in the first light-shielded pixels is larger than an area of the floating diffusions in the second light-shielded pixels.

8. The solid-state imaging device according to claim 1, wherein
the first light-shielded pixels and the second light-shielded pixels each include a floating diffusion, and an impurity concentration in the floating diffusions in the first light-shielded pixels is higher than an impurity concentration in the floating diffusions in the second light-shielded pixels.

9. An imaging apparatus comprising:
a solid-state imaging device;
a controller configured to control the solid-state imaging device; and
wherein
the solid-state imaging device includes:
a plurality of aperture pixels that are used for capturing of an image;
a plurality of first light-shielded pixels that are shielded from light for detection of a first dark current, the first light-shielded pixels having a first dark current generating rate at a given temperature that is larger than a dark current generating rate at the given temperature for the aperture pixels; and
a plurality of second light-shielded pixels that are shielded from light for detection of a second dark current and having a second dark current generating rate at the given temperature that is smaller than a dark current generating rate at the given temperature for the aperture pixels, the second light-shielded pixels having a different physical structure from the plurality of first light-shielded pixels and
pixel values of the plurality of aperture pixels, the plurality of first light-shielded pixels, and the plurality of second light-shielded pixels are read out independently of each other, and a dark current for the aperture pixels is determined based on the first and second dark currents.

* * * * *